(12) United States Patent
Rostron

(10) Patent No.: US 8,659,862 B2
(45) Date of Patent: Feb. 25, 2014

(54) DIRECTIONAL FAULT LOCATION AND ISOLATION SYSTEM

(75) Inventor: Joseph R. Rostron, McDonough, GA (US)

(73) Assignee: SSI Power, LLC, Hampton, GA (US)

( * ) Notice: Subject to any disclaimer, the term of this patent is extended or adjusted under 35 U.S.C. 154(b) by 356 days.

(21) Appl. No.: 13/229,095

(22) Filed: Sep. 9, 2011

(65) Prior Publication Data
US 2012/0063040 A1    Mar. 15, 2012

Related U.S. Application Data

(60) Provisional application No. 61/381,518, filed on Sep. 10, 2010.

(51) Int. Cl.
H02H 3/00    (2006.01)

(52) U.S. Cl.
USPC .................................. 361/62; 361/65; 361/66

(58) Field of Classification Search
None
See application file for complete search history.

(56) References Cited

U.S. PATENT DOCUMENTS

| | | | | |
|---|---|---|---|---|
| 4,352,137 A | * | 9/1982 | Johns | 361/82 |
| 4,591,992 A | * | 5/1986 | Yamaura | 702/59 |
| 4,896,241 A | * | 1/1990 | Li et al. | 361/66 |
| 4,922,368 A | * | 5/1990 | Johns | 361/62 |
| 5,796,259 A | * | 8/1998 | Dickmander | 324/524 |
| 6,714,395 B2 | * | 3/2004 | Meisinger et al. | 361/62 |
| 6,914,762 B2 | * | 7/2005 | Bo | 361/62 |
| 7,710,698 B2 | * | 5/2010 | Gajic et al. | 361/62 |
| 7,969,155 B2 | * | 6/2011 | Varghai et al. | 324/521 |

* cited by examiner

Primary Examiner — Jared Fureman
Assistant Examiner — Terrence Willoughby
(74) Attorney, Agent, or Firm — Michael J. Mehrman; Mehrman Law Office

(57) ABSTRACT

A directional fault location and isolation system for a three phase electric power circuit that identifies a faulted segment by determining the direction of the fault at multiple tap points in the electric power circuit. The directional fault controller, which may be a centralized controller or a number of peer-to-peer controllers located at the tap points, includes communication equipment for exchanging information with the monitoring equipment and the sectionalizing equipment at each sectionalizing control point, which includes the tap points and may also include the substations. The controller also includes processing equipment that determines the directionality of a fault on the power line at each current monitoring device, identifies a faulted line section by identifying a change in the directionality of the fault associated with the faulted line section, and operates one or more of the sectionalizing switches to isolate the faulted line section from the circuit.

18 Claims, 13 Drawing Sheets

| CMD 40a-1 | CMD 40a-2 | CMD 40b-1 | CMD 40b-2 | CMD 40n-1 | CMD 40n-2 | FAULT LOCATION | TAP FAULT CONFIRMATION | RECLOSE LEAVING OPEN |
|---|---|---|---|---|---|---|---|---|
| ⇓ | ⇓ | ⇓ | ⇓ | ⇓ | ⇓ | 14a | | CB1 & SW42a-1 |
| ⇑ | ⇓ | ⇓ | ⇓ | ⇓ | ⇓ | 16a | YES | SW42a-1 & SW42a-2 |
| ⇑ | ⇑ | ⇓ | ⇓ | ⇓ | ⇓ | 14b | | SW42a-2 & SW42b-1 |
| ⇑ | ⇑ | ⇑ | ⇓ | ⇓ | ⇓ | 16b | YES | SW42b-1 & SW42b-2 |
| ⇑ | ⇑ | ⇑ | ⇑ | ⇓ | ⇓ | 14c | | SW42b-2 & SW42n-1 |
| ⇑ | ⇑ | ⇑ | ⇑ | ⇑ | ⇓ | 16n | YES | SW42n-1 & SW42n-2 |
| ⇑ | ⇑ | ⇑ | ⇑ | ⇑ | ⇑ | 14n | ... | SW42n-2 & CB2 |

SECTIONALIZING SCHEME FOR SWITCH CONFIGURATION SHOWN ON FIG. 10

*FIG. 11*

SECTIONALIZING SCHEME FOR SWITCH CONFIGURATION SHOWN ON FIG. 11

| CMD 40a-1 | CMD 40a-2 | CMD 40b-1 | CMD 40b-2 | CMD 40n-1 | CMD 40n-2 | FAULT LOCATION | TAP FAULT CONFIRMATION | RECLOSE LEAVING OPEN |
|---|---|---|---|---|---|---|---|---|
| ⇓ | ⇓ | ⇓ | ⇓ | ⇓ | ⇓ | 14a | | CB1 & SW42a-1 |
| ⇑ | ⇓ | ⇓ | ⇓ | ⇓ | ⇓ | 16a | YES | SW42a-3 |
| ⇑ | ⇑ | ⇓ | ⇓ | ⇓ | ⇓ | 14b | | SW42a-2 & SW42b-1 |
| ⇑ | ⇑ | ⇑ | ⇓ | ⇓ | ⇓ | 16b | YES | SW42b-3 |
| ⇑ | ⇑ | ⇑ | ⇑ | ⇓ | ⇓ | 14c | | SW42b-2 & SW42n-1 |
| ⇑ | ⇑ | ⇑ | ⇑ | ⇑ | ⇓ | 16n | YES | SW42n-3 |
| ... | ... | ... | ... | ... | ... | ... | ... | ... |
| ⇑ | ⇑ | ⇑ | ⇑ | ⇑ | ⇑ | 14n | | SW42n-2 |

*FIG. 13*

DIRECTIONAL FAULT LOCATION AND ISOLATION SYSTEM

REFERENCE TO RELATED APPLICATION

This application claims priority to U.S. Provisional Patent Application Ser. No. 61/381,518 for the invention, "Fault Location Detection on Tapped Transmission Lines," filed Sep. 10, 2010 and U.S. patent application Ser. No. 13/229,808 entitled "Directional Fault Sectionalizing System" filed Sep. 12, 2011 (published as USApp20120062239), which are both incorporated by reference. Commonly owned U.S. Pat. Nos. 7,191,074 and 7,683,798, are also incorporated by reference.

TECHNICAL FIELD

The present invention relates to electric power systems and, more particularly, relates to a directional fault location and isolation system for a three phase electric power circuit with multiple tap points.

BACKGROUND OF THE INVENTION

Faults in electric power systems occur for a variety of reasons, such as trees falling across power lines, transformer failure, shorts in load circuits, and so forth. Once the line section experiencing the fault has been identified, sectionalizing switches are used to isolate the faulted line segment in order to bring the non-faulted sections back into service. Isolating the fault requires identification of the location of the fault with respect to a number of sectionalizing switches that are used to isolate faulted line sections. For a radial distribution circuit, the direction from the substation toward the load is referred to as the forward direction and the direction back toward the substation is referred to as the reverse direction. For a loop fed transmission or distribution circuit, however, the direction along a power line (forward or reverse) is defined as a matter of convention. Sectionalizing switches and associated monitoring equipment (e.g., voltage and current measuring devices) and fault controllers are typically located at the substations and at major tap points along the power line where transmission or distribution lines "T" from the main power line to pick up loads. When a fault occurs, one or two sectionalizing switches are typically operated to isolate the faulted line segment so that the non-faulted line segments can remain in service.

Determining the directionality of a fault on a three phase power line is conventionally accomplished with a voltage monitor and current monitor for each phase, requiring three voltage monitors and three current monitors at each monitoring station. Current monitors are relatively inexpensive whereas the voltage monitors can be a major expense. Although three phase voltage measurements are typically available in substations, they are not generally available at tap points along the power line. The extent of outages can be reduced, however, by locating directional fault detection equipment at the major tap points along the power line, not just at the substations. But this may not be economically feasible due to the high cost of installing three voltage monitors at each tap point.

There is, therefore, a continuing need for improved and more cost effective electric power fault isolation systems. There is, in particular, a need for a directional fault location and isolation system that can be used to operate sectionalizing switches at multiple tap points on three phase electric power lines.

SUMMARY OF THE INVENTION

The present invention meets the needs described above in a directional fault location and isolation system for a three phase electric power circuit that identifies a faulted segment by determining the direction of the fault at multiple tap points in the electric power circuit. The directional fault controller identifies a faulted line section by identifying a change in the directionality of the fault associated with the faulted line section, and operates one or more of the sectionalizing switches to isolate the faulted line section from the circuit. The directionality of the fault is determined at multiple tap points along the power line, which is not possible with conventional sectionalizing equipment. Determining the direction of a fault at each tap point allows for more precise location and isolation of faults, which minimizes the amount of the circuit that must be disconnected during fault conditions. This increases the precision of fault isolation resulting in fewer line segments, and fewer customers, experiencing outages when faults occur.

More specifically, the monitoring equipment at each tap point includes a forward side current monitoring device and a reverse side current monitoring device. Similarly, the sectionalizing equipment at each tap point includes a forward side sectionalizing switch and a reverse side sectionalizing switch. Each tap point also includes communication equipment for exchanging information with a directional fault controller, which may be configured as a centralized controller or as a number of peer-to-peer controllers located at the tap points.

The directional fault controller identifies a faulted segment by determining the direction of the fault at each monitoring station in the electric power circuit. The directional fault controller includes communication equipment for exchanging information with the monitoring equipment and the sectionalizing equipment at each tap point. The controller also includes processing equipment that determines the directionality of a fault on the power line at each current monitoring device, identifies a faulted line section by identifying a change in the directionality of the fault associated with the faulted line section, and operates one or more of the sectionalizing switches to isolate the faulted line section from the circuit.

In addition, the directional fault controller detects a faulted phase on a tapped line section by applying a fault detection analysis to the difference between the currents on the main power line on the forward side and on the reverse side of the tap point connected to the tapped line section. The controller also confirms a fault occurring on a tapped line section by implementing a differential current analysis using the difference between the currents on the tapped line section before and during the fault. In addition, the controller may determines directionality of a fault at each current monitoring device using three phase current measurements provided by the current monitoring device and a single phase voltage measurement or reference. The controller may also identify a faulted phase of the power line and determine directionality of the fault on the faulted phase.

BRIEF DESCRIPTION OF THE DRAWINGS

FIG. 11 is a chart showing a multi-point sectionalizing scheme for the loop-fed electric power circuit.

FIG. 13 is a chart showing a sectionalizing scheme for the alternative directional fault sectionalizing system.

DETAILED DESCRIPTION OF THE EMBODIMENTS

Figure 1:
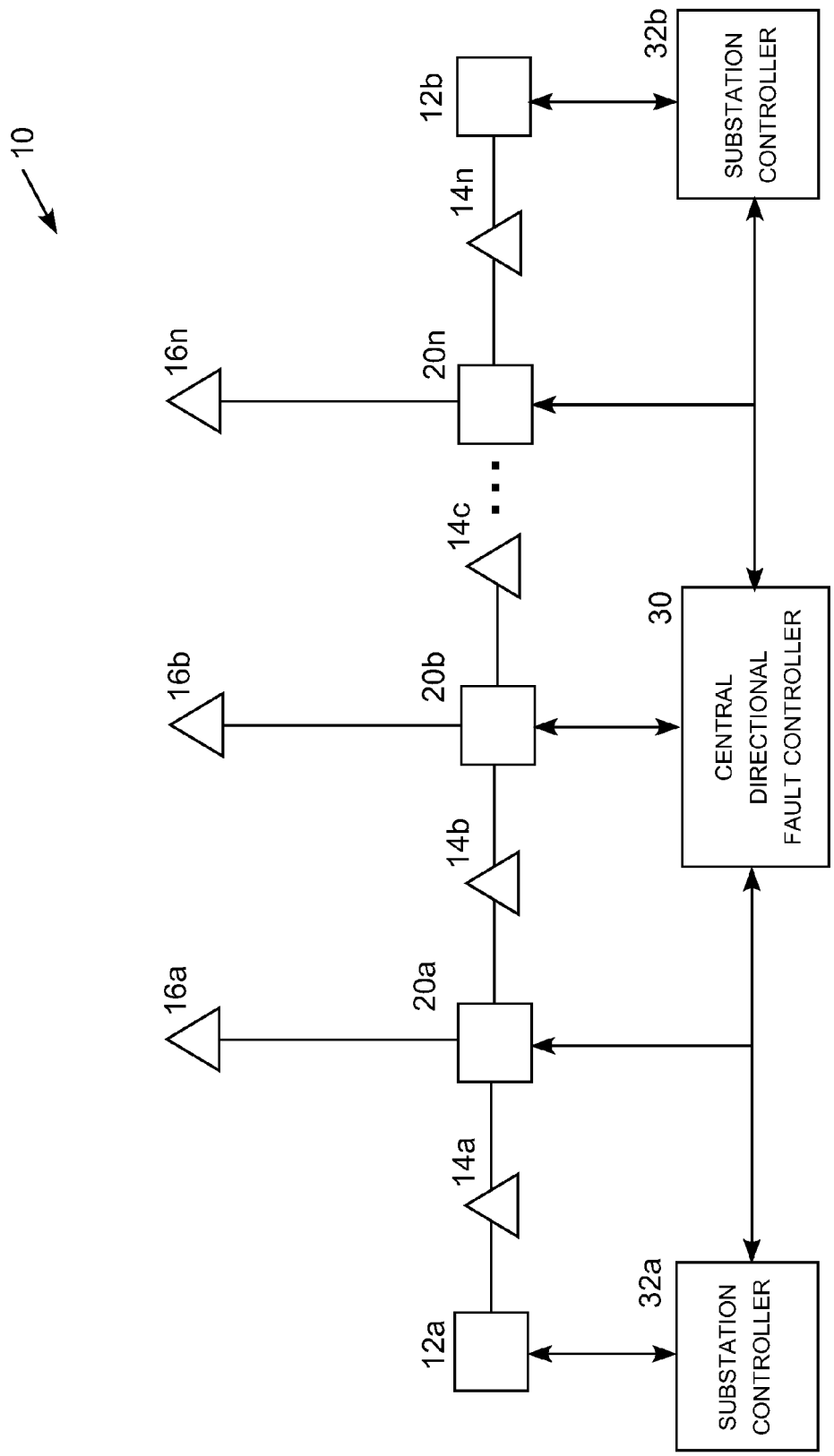
FIG. 1 is a schematic diagram illustrating directional fault sectionalizing system on a loop fed electric power circuit with centralized control.

The present invention may be embodied in a directional fault location and isolation system for a three phase electric power circuit that identifies a faulted segment by determining the direction of the fault at multiple tap points in the electric power circuit. The directional fault controller, which may be a centralized controller or a number of peer-to-peer controllers located at the tap points, includes communication equipment for exchanging information with the monitoring equipment and the sectionalizing equipment at each sectionalizing control point, which includes the tap points and may also include the substations. The controller also includes processing equipment that determines the directionality of a fault on the power line at each current monitoring device, identifies a faulted line section by identifying a change in the directionality of the fault associated with the faulted line section, and operates one or more of the sectionalizing switches to isolate the faulted line section from the circuit.

The directional fault sectionalizing system at each tap point utilizes a single phase voltage measurement and three simultaneous phase current measurements to determine the direction of a fault occurring on a single phase of a three phase electric power circuit. While the invention is not adapted to determine the directionality of multi-phase faults, the great majority of faults on transmission and distribution circuits are of the single-phase variety. As a result, the resulting ability to increase the precision of fault isolation for single-phase faults captures the great majority of the benefit that can be achieved through directional fault detection. The directional fault sectionalizing system is particularly useful for commonly used three-way tap points along transmission and distribution lines where three phase voltage measurement is not readily available. A low voltage single phase voltage is commonly available to charge batteries for RTUs and motor operators for disconnect switches. This voltage can be used for the directional fault detection system without the need for an additional transformer. The system is also capable of identifying faults under challenging circumstances, such faults occurring on unbalanced three phase power lines, high impedance faults, and faults occurring on tapped line segments where the currents are relatively small compared to the currents flowing in the main power line.

The key technological advance is the ability to determine fault directionality at a three phase monitoring point using one phase voltage measurement and three phase current measurements. Once the capability to determine the fault directionality at any particular monitoring point has been developed, this capability can be expanded to create a directional fault sectionalizing system for more complex circuit configurations. For example, a directional fault sectionalizing system can be constructed for a three-way tap point that includes a sectionalizing switch and associated monitoring point on each of the main line segments serving the tap point. In particular, the directional fault sectionalizing system for a three-way tap point typically controls two sectionalizing switches (i.e., forward and reverse switches) through the use of a single phase voltage measurement and a pair of three-phase current measuring devices ("CMDs"), a first CMD located on the forward line segment and a second CMD located on the reverse line segment.

The directional fault controller determines the directionality of the fault at a particular monitoring point using a single phase voltage measurement and three phase current measurements through phasor analysis. These measurements are obtained for the same instant in time, which allows the directional fault controller to employ phasor analysis to determine the directionality of the fault. A first element of the directional fault analysis is phase voltage synthesis. The phase angles for the unmeasured phase voltages are synthesized by designating them to be 120 degrees out of phase with the measured phase voltage. The designated phase voltage angles are assigned to the correct phases by minimizing the phase angles between the current and voltage for each phase. This technique synthesizes the phase voltage angles for the unmeasured phases with sufficient accuracy for the purpose of determining the directionality of the fault.

A second element of the directional fault analysis is faulted phase identification. The directional fault controller identifies the faulted phase by computing the positive, negative and zero sequence current components for each phase from the phase current measurements. The faulted phase is then identified as the phase where the difference between the phase angles of the negative and zero sequence currents drops below a fault threshold value, which is typically set to 60 degrees. On an un-faulted phase, the difference between the phase angles of the negative and zero sequence currents is near 90 degrees, while the phase angle difference tends to collapse toward zero on a faulted line with higher resistance faults resulting in higher post-fault phase angle differences. As a result, a fault threshold value in the range of 60 degrees is considered appropriate for detecting a fault on a particular phase.

Once the faulted phase has been identified, single-phase fault direction analysis is used to determine the directionality of the fault on the faulted phase. More specifically, the current lag between the current and the voltage for the faulted phase is determined. A forward direction fault is indicated by a current lag less than a direction threshold value, whereas a reverse direction fault is indicated by a current lag greater than the direction threshold value. The current lag for a fault in the forward direction is always somewhat less than 90 degrees and tends toward zero degrees as the resistance of the fault increases. A direction threshold of 90 degrees is therefore considered appropriate for detecting a forward direction fault (i.e., the fault is determined to be in the forward direction fault when the current lag is less than 90 degrees). In addition, the current lag for fault in the reverse direction is always somewhat less than 270 degrees, and tends toward 180 degrees as the resistance of the fault increases. A direction threshold of 90 degrees is therefore also considered appropriate for detecting a reverse direction fault (i.e., the fault is determined to be in the reverse direction fault when the current lag is greater than 90 degrees).

Once the capability to determine the fault directionality at any particular monitoring point has been developed, this capability can be expanded to create a directional fault sectionalizing system for more complex circuit configurations. For a three-way tap point, for example, two sectionalizing switches are employed, a first sectionalizing switch on line section 1 (forward line segment), a second sectionalizing switch on line section 2 (reverse line segment). In addition, one phase voltage measuring device and two CMDs are employed, a first CMD on segment 1 and a second CMD on segment 2. A directional fault controller determines the direction of the fault at the first CMD (on the forward line segment) using the single phase voltage measurement and the three phase current measurements from the first CMD. The directional fault controller also determines the direction of the fault at the second CMD (on the reverse line segment) using the single phase voltage measurement and the three phase current measurements from the second CMD.

These two fault direction determinations are typically sufficient to operate the sectionalizing switches. Specifically, if the direction of the fault is in the forward direction at both CMDs, the first sectionalizing switch on segment 1 (forward line segment) is opened unless it can be determined that the fault has occurred beyond of the next sectionalizing switch in the forward direction, which may be determined by a similar directional fault sectionalizing system located at the next sectionalizing switch in the forward direction. Similarly, if the direction of the fault is in the reverse direction at both CMDs, the second sectionalizing switch on segment 2 (reverse line segment) is opened unless it can be determined that the fault has occurred beyond of the next sectionalizing switch in the reverse direction, which may be determined by a similar directional fault sectionalizing system located at the next sectionalizing switch in the forward direction. In addition, when the direction of the fault is in the reverse direction at the first CMD and in the forward direction at the second CMD (i.e., the direction of the fault is toward the tap from both directions), this indicates that the fault has occurred on the tapped line segment. In this case, both the first and second sectionalizing switches are opened to isolate the tap point from the power line. In a loop fed power line, the remainder of the power line remains in service with the opened sectionalizing switches isolating the fault on the tapped line segment from the power line.

As the current on the tapped line segment can be derived as the difference between the currents on the segments 1 and 2, a third CMD is not required for the tapped line segment. But in some cases, a third sectionalizing switch may be located on the tapped line segment to maintain loop-fed electric service when a tapped line section is isolated from the circuit. In this case, the directional fault sectionalizing system opens the sectionalizing switch on the tapped line to isolate the tapped line segment from the power line when a fault occurs on the tapped line segment. This allows the remainder of the power line to remain in service when a fault occurring on the tapped segment is isolated from a radial power line.

In some cases, a fault can be falsely detected under difficult fault detection conditions, such as an unbalanced load, a high impedance fault, and when the fault occurs on the tapped line segment where the current is relatively small compared to the currents flowing in the main line segments. As an additional safeguard to avoid a false fault detection, an additional fault detection analysis can be performed for the tapped line segment. In this case, the phasor analysis described above is applied to the difference between the segment 1 and segment 2 line currents before and during the fault (i.e., the differential current, before and during the fault, on the tapped line segment). That is, the positive, negative and zero sequence currents on each phase are computed for the differential current. The phase angle difference between the negative and zero sequence currents is then computed for the differential current for each phase. A fault is detected on a particular phase if the phase angle difference between the negative and zero sequence currents has collapsed below the fault threshold value (e.g., 60 degrees) on that phase. Typically, the fault detected with the differential current analysis will be on the same phase determined during the original fault detection analysis using the full line currents, providing verification of the fault and the faulted phase.

The companion application U.S. Ser. No. 13/229,808 entitled "Directional Fault Sectionalizing System" describes in greater detail how the fault directionality is determined at each monitoring point and the CMDs are described in commonly owned U.S. Pat. Nos. 7,191,074 and 7,683,798, which are incorporated by reference. The following description explains how multiple directional fault monitoring points are operated in a coordinated manner to implement a sectionalizing system for an electric power line with multiple tap points.

Turning now to the figures, FIG. 1 is a schematic diagram illustrating directional fault sectionalizing system 10 on a loop fed electric power circuit with centralized control. The electric power line extends from a first substation 12a to a second substation 12b. This generalized circuit includes "n" three-way tap points 20a-n between the substations. The connected loads between the first substation 12a and the first tap point 20a are represented by a load 14a, the connected loads between the first tap point 20a and the second tap point 20b are represented by a load 14b, the connected loads between the second tap point 20b and the "nth" tap point 20n are represented by a load 14c, and the connected loads between the "nth" tap point 20n and the second substation 12b are represented by a load 14n. In addition, the connected loads served by the first tap point 20a are represented by the load 16a, the connected loads served by the second tap point 20b are represented by the load 16b, and the connected loads served by the "nth" tap point 20n are represented by the load 16n.

Each tap point 20a-n includes a directional sectionalizing system as described with reference to FIG. 10. Although the substations do not need directional fault controllers, each substation 12a-b includes a sectionalizing switch or circuit breaker that can be operated as part of the sectionalizing system. Each substation and each tap point can therefore be operated as a sectionalizing control point in the sectionalizing system. Each tap point includes a directional sectionalizing system that has two directional monitoring points, two sectionalizing switches, and a directional fault controller (which may be local or remote, centralized or peer-to-peer), as described below with reference to FIGS. 1 and 2. The use of two directional monitoring points allows the sectionalizing control system to know the directionality of a fault on both sides of the tap point. This allows the control system to know whether the fault occurred in the forward direction from the tap point, in the reverse direction from the tap point, or at the tap point in the tap-connected line segment. This information is used to implement the intelligent sectionalizing scheme, as described with reference to FIGS. 3-9.

FIG. 1 illustrates a centralized sectionalizing control system in which the directional fault controllers for all of the tap points are implemented in a centralized fault controller 30. That is, each directional sectionalizing system and substation includes communication equipment, such as SCADA equipment, that transmits the monitored and/or computed values to the centralized fault controller 30, which implements a centralized sectionalizing scheme and remotely controls the sectionalizing switches at the tap points and the substations via the substation controllers 32a-b. The central controller likewise includes communication equipment for exchanging information with the monitoring equipment and the sectionalizing equipment at each sectionalizing control point, which includes the tap points and may also include the substations. The control scheme illustrated in FIG. 1 can be replicated through the electric power network to implement intelligent sectionalizing network wide.

Figure 2:
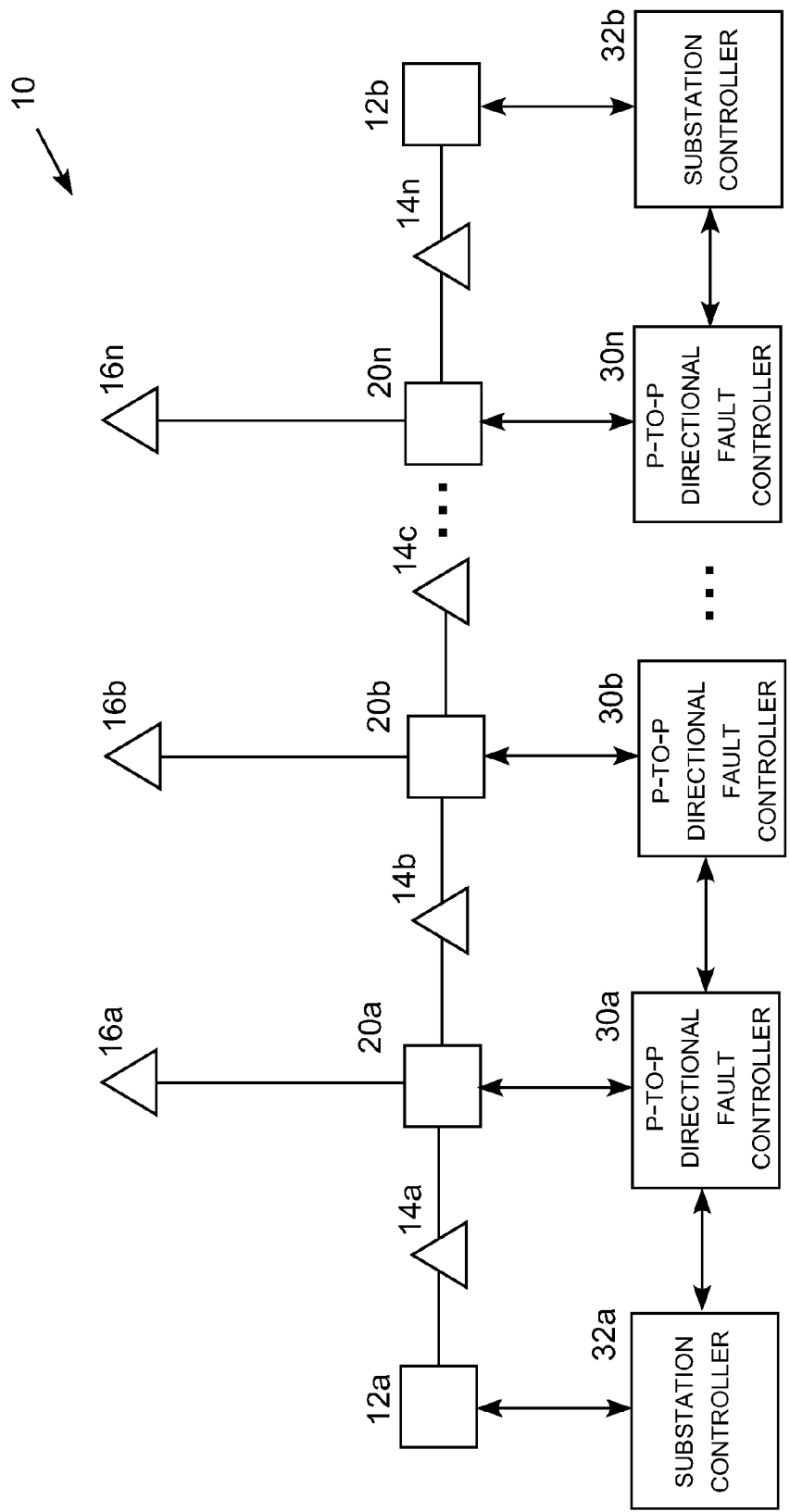
FIG. 2 is a schematic diagram illustrating directional fault sectionalizing system for an electric power circuit with distributed peer-to-peer control.

FIG. 2 is a schematic diagram illustrating multi-point directional fault sectionalizing system 10 for an electric power circuit with distributed peer-to-peer control. In this alternative, the centralized directional fault controller 30 shown in FIG. 1 has been replaced by a number of peer-to-peer controllers 30a-n located at the tap points. To implement the sectionalizing scheme, each tap point needs to know the directionality of a fault at the next sectionalizing control point (i.e., tap point or substation) in the forward and reverse directions. Each sectionalizing control point therefore communicates with the next control point in the forward and reverse directions in order to implement its own sectionalizing scheme. The peer-to-peer control scheme shown in FIG. 2 can therefore be implemented even when there is a failure in the centralized control scheme. In addition, the peer-to-peer control scheme can be implemented as a back-up for the centralized control scheme in the event of a failure in the centralized control scheme. In this type of redundant control scheme, the sectionalizing control points ordinarily communicate with the centralized directional fault controller, and revert to peer-to-peer communication in the event of a failure in the centralized control system.

Basically, the control system determines the location of a fault by identifying where the directionality of the fault changes direction. If the directionality changes at a tap point, this indicates that the fault has occurred on the tap-connected load. If the directionality changes between two control points (substation or tap point), this indicates that the fault has occurred between those tap points. As a result, the system implements the sectionalizing control scheme based on the directionality of the fault on each side of each tap point, which is determined by the directional sectionalizing system shown in FIG. 10 located at teach tap point.

However communication and control is implemented, the basic sectionalizing scheme remains the same, as illustrated with reference to FIGS. 3-9 below. As a matter of convention, the forward direction is defined to be toward substation 12a (right to left on FIGS. 3-9) and the reverse direction is defined to be toward substation 12b (left to right on FIGS. 3-9). To illustrate the sectionalizing control scheme, FIGS. 3-9 show the monitoring equipment located at the tap point including a forward side monitoring point CMD 40a-1 on the forward side of the first tap point 20a and the reverse side monitoring point CMD 40a-2 on the reverse side of the first tap point 20a. FIG. 3-9 also show the sectionalizing equipment at the tap point including forward side sectionalizing switch 42a-1 on the forward side of the first tap point 20a and the reverse side sectionalizing switch 42a-2 on the reverse side of the first tap point 20a. Similarly, the forward side monitoring point CMD 40b-1 is located on the forward side of the second tap point 20b, the reverse side point CMD 40b-2 is located on the reverse side of the second tap point 20b, the forward side sectionalizing switch 42b-1 is located on the forward side of the second tap point 20b, and the reverse side sectionalizing switch 42b-2 is located on the reverse side of the second tap point 20b. In like manner, the forward side monitoring point CMD 40n-1 is located on the forward side of the "nth" tap point 20n, the reverse side point CMD 40n-2 is located on the reverse side of the "nth" tap point 20n, the forward side sectionalizing switch 42n-1 is located on the forward side of the "nth" tap point 20n, and the reverse side sectionalizing switch 42n-2 is located on the reverse side of the "nth" tap point 20b.

Figure 3:
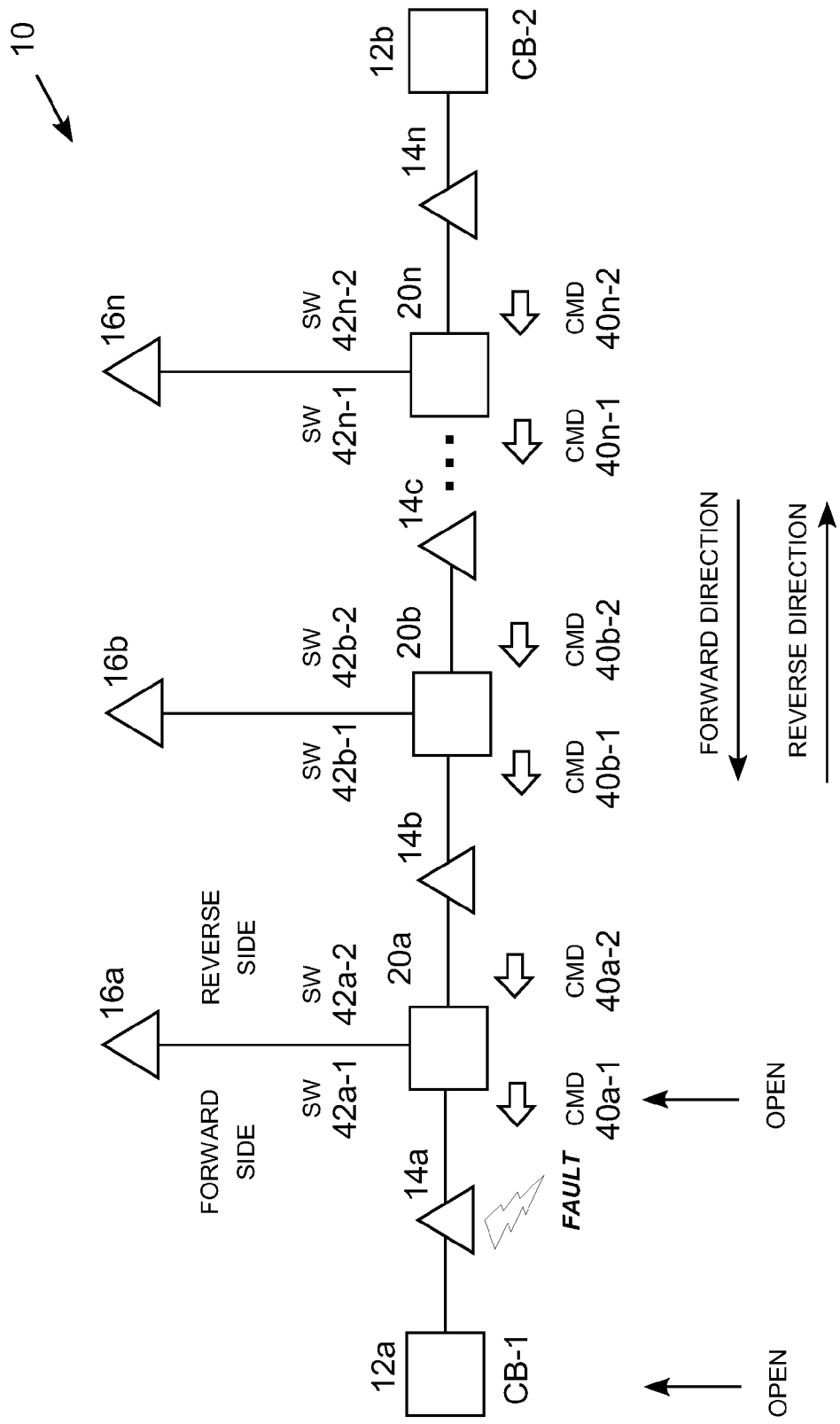
FIG. 3 is a schematic diagram illustrating a sectionalizing scheme for a first fault location on the electric power circuit.

FIG. 3 is a schematic diagram illustrating the sectionalizing scheme for a fault occurring on the load 14a between the first substation 12a and the first tap point 20a. This fault location is identified by determining that the fault is located in the forward direction from the forward side monitoring point 40a-1 at the first tap point 20a. The fault on the load 14a is then isolated by opening the switches at the first substation 12a (typically a circuit breaker CB-1) and the forward side sectionalizing switch 42a-1 at the first tap point 20a. This disconnects the load 14a from the circuit while allowing the remainder of the circuit to be back fed from the second substation 12b.

Figure 4:
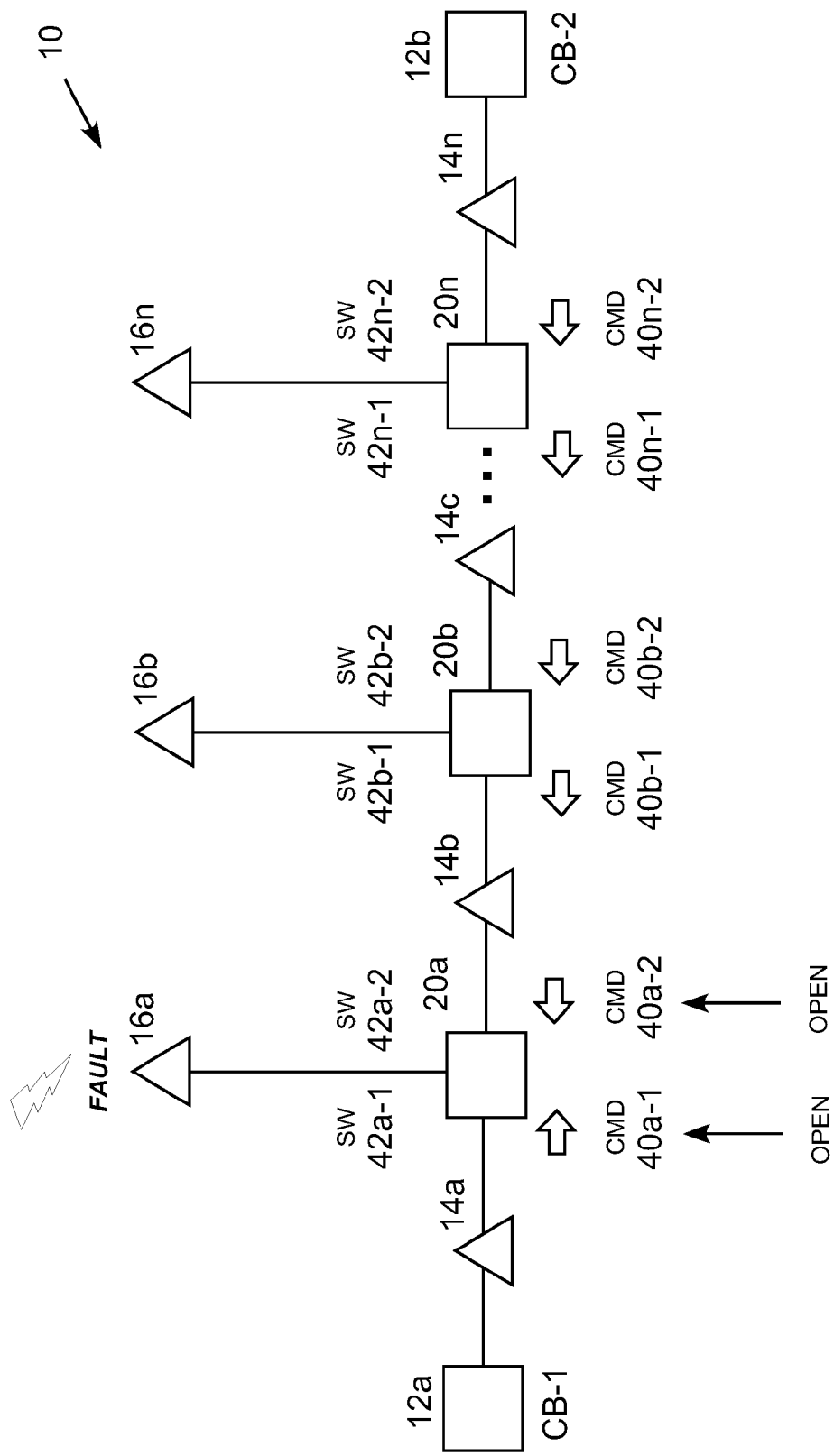
FIG. 4 is a schematic diagram illustrating a sectionalizing scheme for a second fault location on the electric power circuit.

FIG. 4 is a schematic diagram illustrating the sectionalizing scheme for a fault occurring on the tapped load 16a served by the first tap point 20a. This fault location is identified by determining that the directionality of the fault changes between forward side monitoring point 40a-1 and the reverse side monitoring point 40a-2 at the first tap point 20a. The fault on the load 16a is then isolated by opening the forward side sectionalizing switch 42a-1 and the reverse side sectionalizing switch 42a-2 at the first tap point 20a. This disconnects the load 16a from the circuit while allowing the line section forward of the sectionalizing switch 42a-1 to be fed from the first substation 12a, and allowing the line section reverse of the sectionalizing switch 42a-2 to be fed from the second substation 12b. It should be noted that a third sectionalizing switch located on the tapped line segment could alternatively be used to sectionalize the load 16a, while leaving the line-connected switches 42a-1 and 42a-2 closed. However, a third sectionalizing switch is not required to implement the sectionalizing scheme and ordinarily omitted for this purpose.

Figure 5:
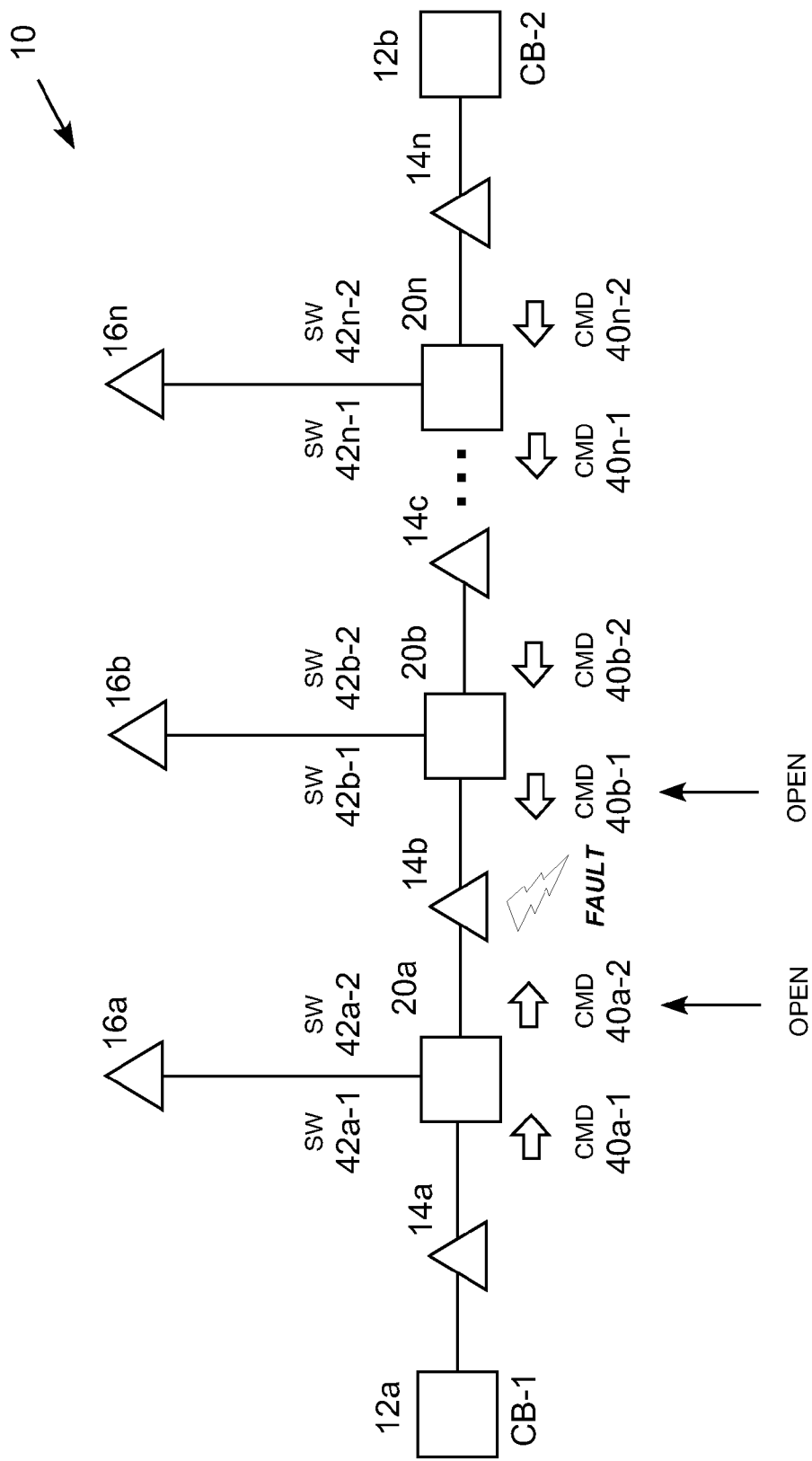
FIG. 5 is a schematic diagram illustrating a sectionalizing scheme for a third fault location on the electric power circuit.

FIG. 5 is a schematic diagram illustrating the sectionalizing scheme for a fault occurring on the load 14b between the first tap point 20a and the second tap point 20b. This fault location is identified by determining that the directionality of the fault changes between reverse side monitoring point 40a-2 at the first tap point 20a and the forward side monitoring point 40b-1 at the second tap point 20b. The fault on the load 14b is then isolated by opening the reverse side sectionalizing switch 42a-2 at the first tap point 20a and the forward side sectionalizing switch 42b-1 at the second tap point 20b. This disconnects the load 14b from the circuit while allowing the line section forward of the sectionalizing switch 42a-2 to be fed from the first substation 12a, and allowing the line section reverse of the sectionalizing switch 42b-1 to be fed from the second substation 12b.

Figure 6:
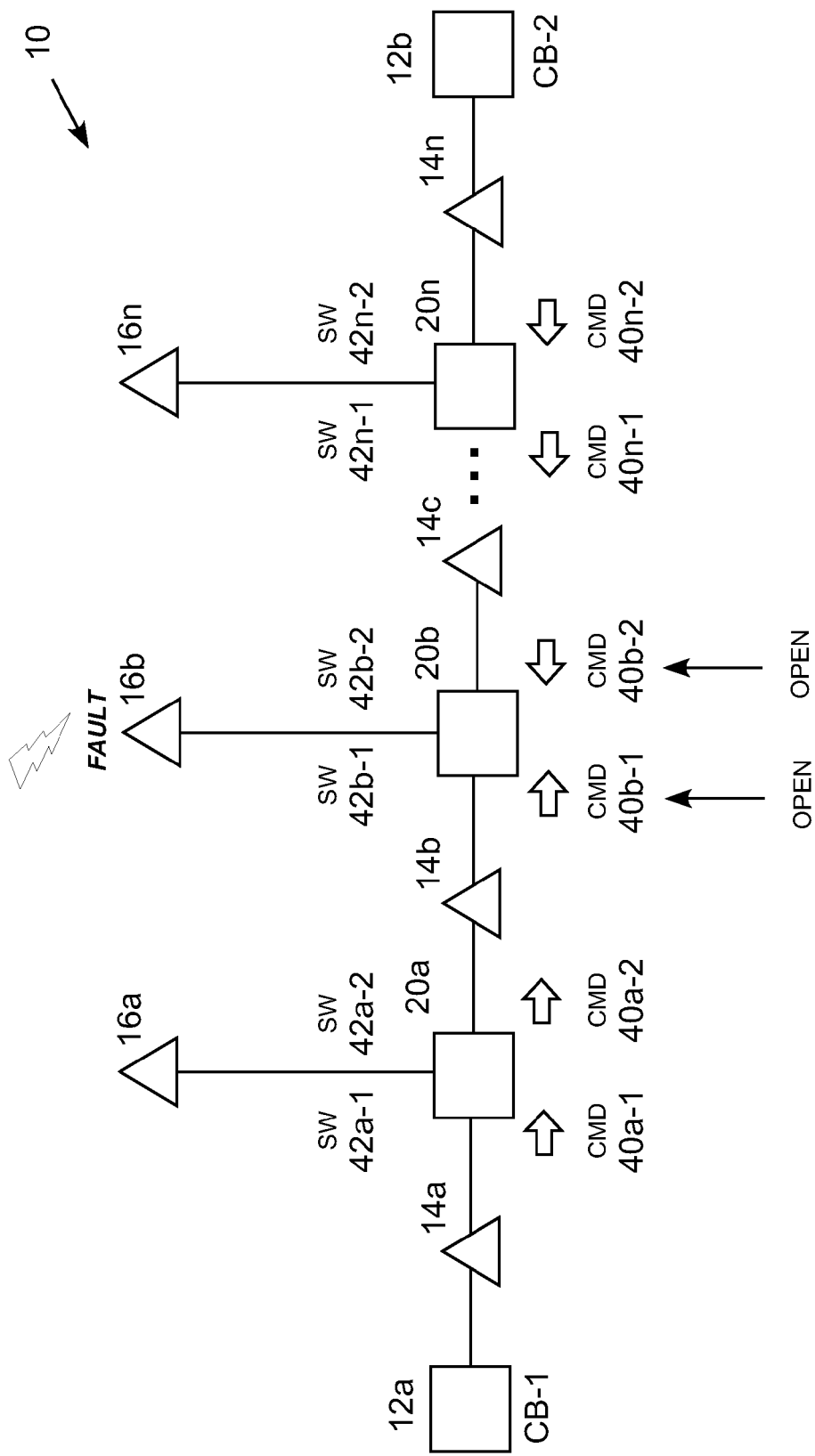
FIG. 6 is a schematic diagram illustrating a sectionalizing scheme for a fourth fault location on the electric power circuit.

FIG. 6 is a schematic diagram illustrating the sectionalizing scheme for a fault occurring on the tapped load 16b served by the first tap point 20b. This fault location is identified by determining that the directionality of the fault changes between forward side monitoring point 40b-1 and the reverse side monitoring point 40b-2 at the second tap point 20b. The fault on the load 16b is then isolated by opening the forward side sectionalizing switch 42b-1 and the reverse side sectionalizing switch 42b-2 at the second tap point 20b. This disconnects the load 16b from the circuit while allowing the line section forward of the sectionalizing switch 42b-1 to be fed from the first substation 12a, and allowing the line section reverse of the sectionalizing switch 42b-2 to be fed from the second substation 12b.

Figure 7:
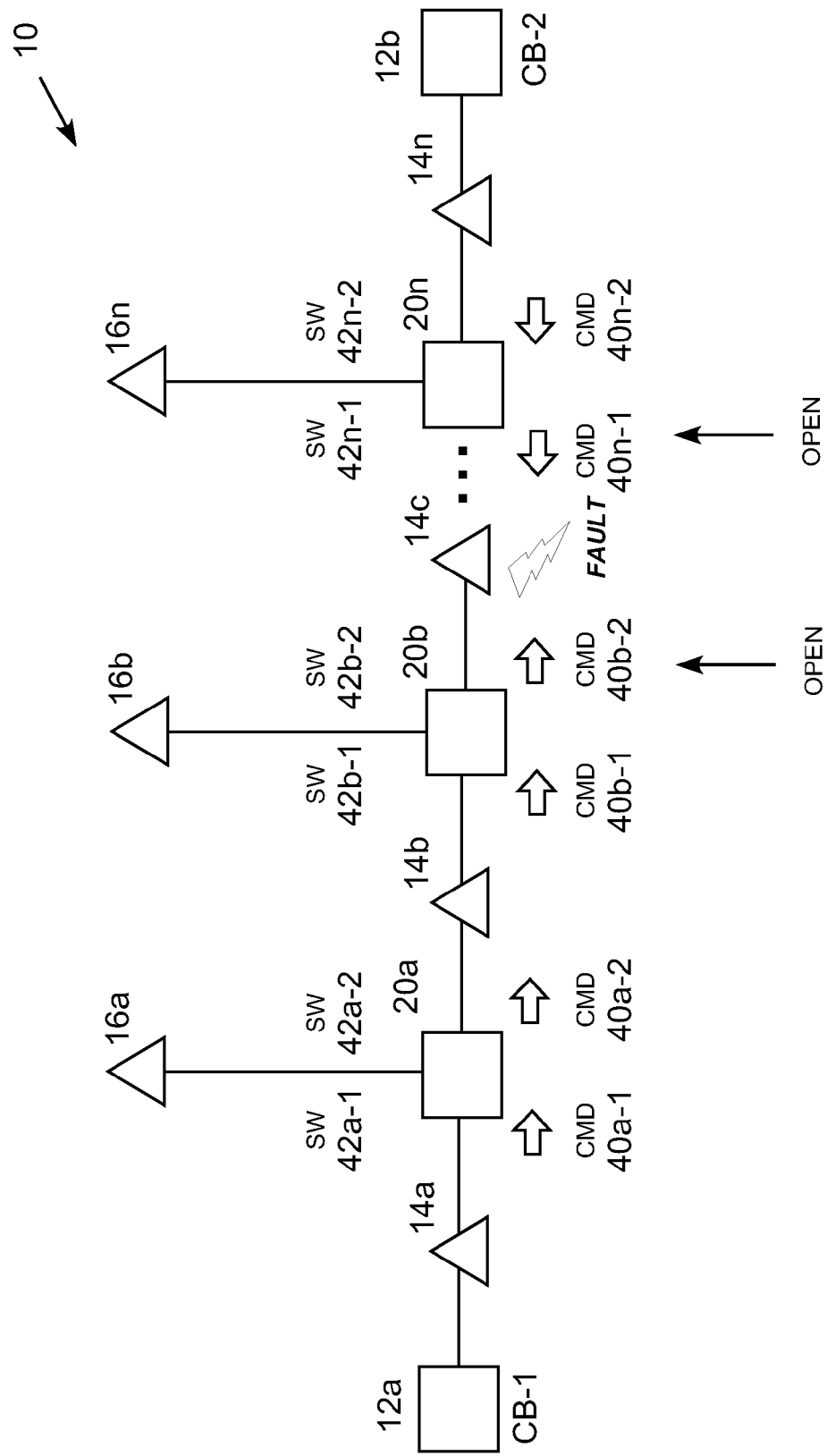
FIG. 7 is a schematic diagram illustrating a sectionalizing scheme for a fifth fault location on the electric power circuit.

FIG. 7 is a schematic diagram illustrating the sectionalizing scheme for a fault occurring on the load 14c between the second tap point 20b and the "nth" tap point 20n. This fault location is identified by determining that the directionality of the fault changes between reverse side monitoring point 40b-2 at the second tap point 20b and the forward side monitoring point 40n-1 at the "nth" tap point 20n. The fault on the load 14c is then isolated by opening the reverse side sectionalizing switch 42b-2 at the second tap point 20b and the forward side sectionalizing switch 42n-1 at the "nth" tap point 20b. This disconnects the load 14c from the circuit while allowing the line section forward of the sectionalizing switch 42b-2 to be fed from the first substation 12a, and allowing the line section reverse of the sectionalizing switch 42n-1 to be fed from the second substation 12b.

Figure 8:
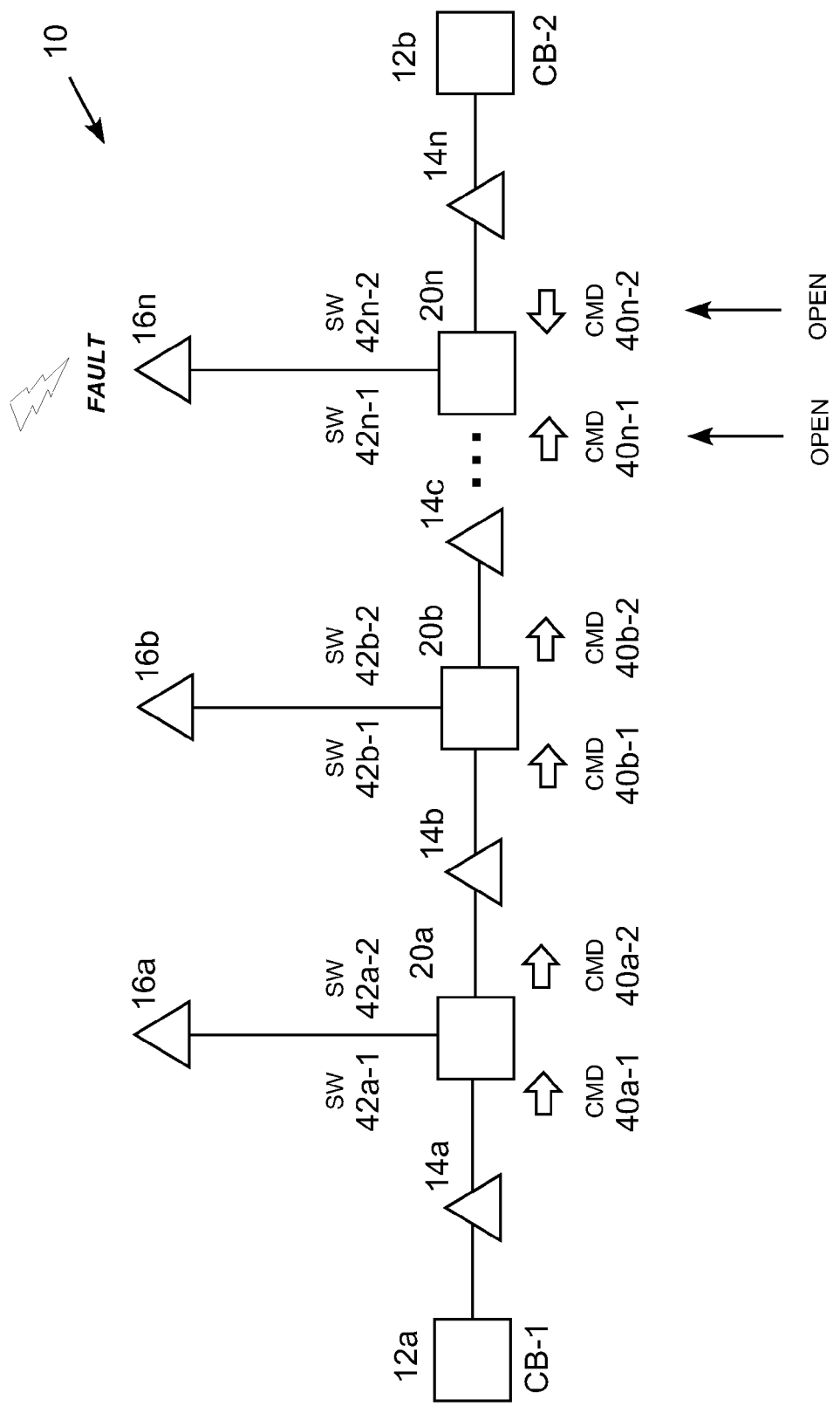
FIG. 8 is a schematic diagram illustrating a sectionalizing scheme for a sixth fault location on the electric power circuit.

FIG. 8 is a schematic diagram illustrating the sectionalizing scheme for a fault occurring on the tapped load 16n served by the "nth" tap point 20n. This fault location is identified by determining that the directionality of the fault changes between forward side monitoring point 40n-1 and the reverse side monitoring point 40n-2 at the "nth" tap point 20n. The fault on the load 16n is then isolated by opening the forward side sectionalizing switch 42n-1 and the reverse side sectionalizing switch 42n-2 at the "nth" tap point 20n. This disconnects the load 16n from the circuit while allowing the line section forward of the sectionalizing switch 42n-1 to be fed from the first substation 12a, and allowing the line section reverse of the sectionalizing switch 42n-2 to be fed from the second substation 12b.

Figure 9:
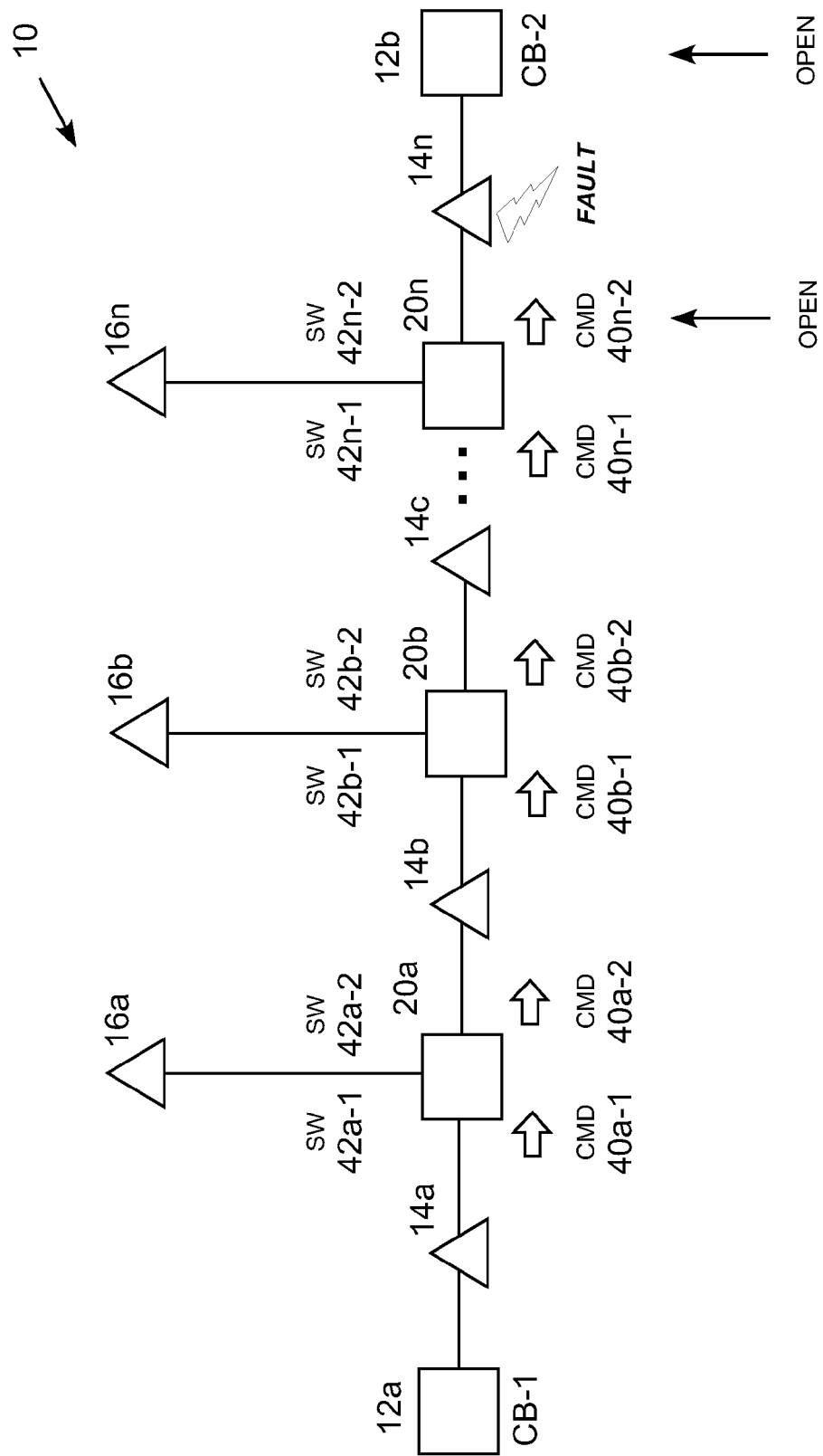
FIG. 9 is a schematic diagram illustrating a sectionalizing scheme for a seventh fault location on the electric power circuit.

FIG. 9 is a schematic diagram illustrating the sectionalizing scheme for a fault occurring on the load 14n between the "nth" tap point 20n and the second substation 12b. This fault location is identified by determining that the fault is located in the reverse direction from the reverse side monitoring point 40n-2 at the "nth" tap point 20n. The fault on the load 14n is then isolated by opening the switches at the second substation 12b (typically a circuit breaker CB-2) and the reverse side sectionalizing switch 42n-s at the "nth" tap point 20n. This disconnects the load 14n from the circuit while allowing the remainder of the circuit to be fed from the first substation 12a.

Figure 10:
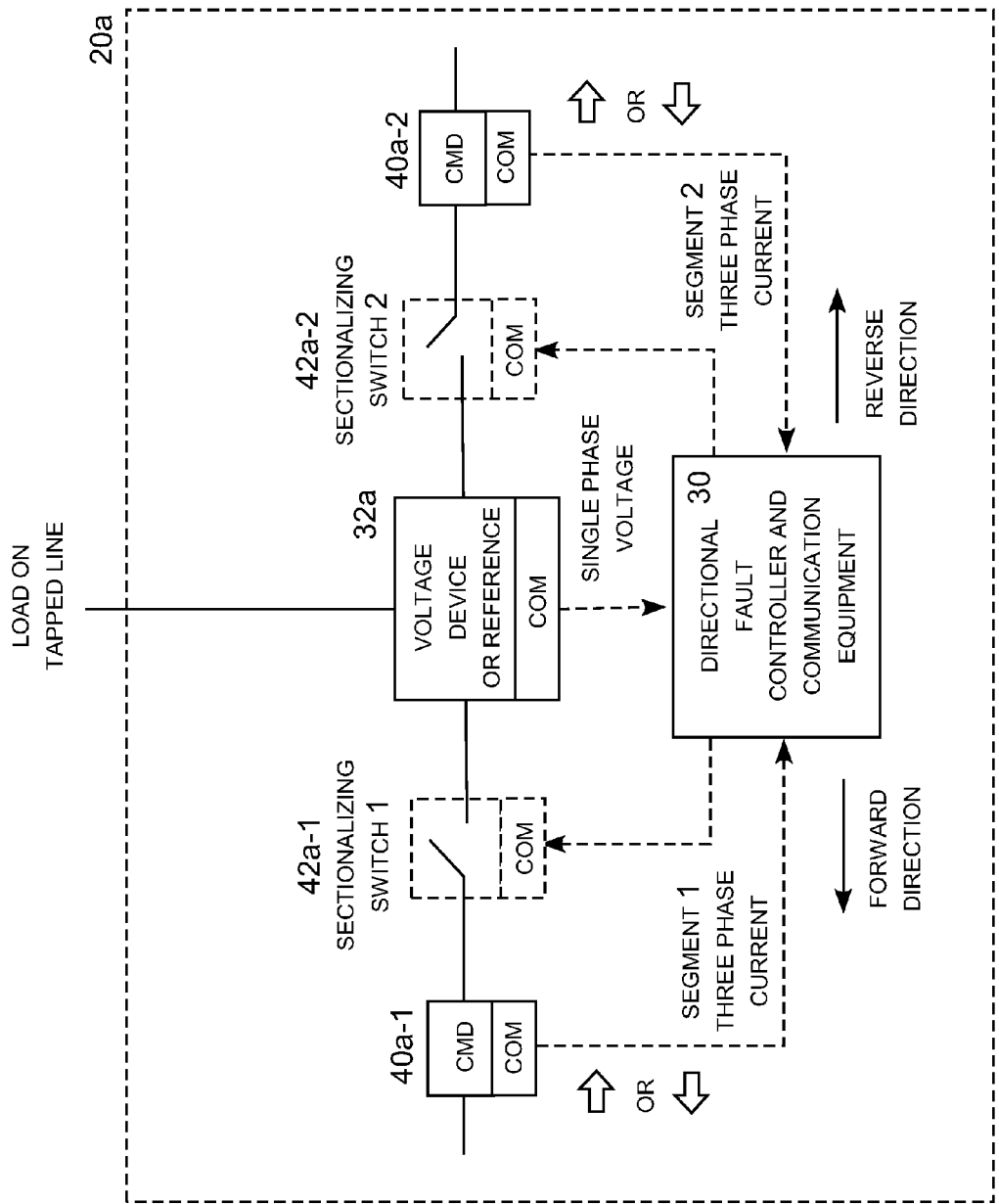
FIG. 10 is a schematic diagram illustrating a directional fault sectionalizing system for a tap point on a loop-fed electric power circuit.

FIG. 10 is a schematic diagram illustrating the directional fault sectionalizing system at the tap point 20a, which is illustrative of the sectionalizing system configuration used at all of the tap points 20a-n on the loop-fed electric power circuit shown in FIG. 1. The monitoring equipment of the directional fault sectionalizing system typically includes two monitoring points (CMDs) 40a-1 and 40a-2, one on each power line side (designated as forward and reverse) of the tap point. This gives the sectionalizing system the capability to determine the direction of the fault on both the forward and reverse line segments the tap point. Implementing this type of directional fault sectionalizing system at each tap point allows for cost effective directional fault identification and isolation throughout the transmission and distribution system. The sectionalizing equipment of the directional sectionalizing system also includes two sectionalizing switches 42a-1 and 42a-2, one on each power line side of the tap point. This gives the sectionalizing system the capability to separate from the forward line section by opening the switch 42a-1, from the reverse line section by opening the switch 42a-2, and to isolate the tapped load 16a from the power line by opening both switches.

The directional fault controller 30 (which man be local or remote, centralized or peer-to-peer) determines the directionality of faults occurring on the power line using three phase current measurements from the current monitoring points (CMDs 42a-1 and 42a-2) and a single phase voltage measurement or reference. A voltage device or reference 32a, which in some cases may be part of the existing power circuit or it may be added as part of the sectionalizing system, provides a single-phase voltage measurement at or near the tap point. This gives the sectionalizing system the capability to determine the direction of the fault on both the forward and reverse line segments at the tap point using only three phase current measurements and a single voltage measurement or reference, resulting in a very cost effective directional fault controller.

FIG. 11 is a chart showing a multi-point sectionalizing scheme for the loop-fed electric power circuit. The changes in fault directionality, along with the sectionalizing operations, shown and described previously with reference to FIGS. 3-9 are summarized in FIG. 11. Table 11 shows a column for "Tap Fault Confirmation" for faults occurring on a tapped line section.

As noted previously, a fault can be falsely detected under difficult fault detection conditions, such as unbalanced loads, a high impedance fault, and when the fault occurs on the tapped line segment where the current is relatively small compared to the current flowing in the main power line. The current on the main power line is typically much higher than the current on the tapped power line. For example, the current on the main line may be on the order of hundreds of Amperes, while the current on a tapped line may be on the order of tens of Amperes. The "Tap Fault Confirmation" step confirms the existence of faults occurring on the tapped line section through a differential current analysis, in which the fault identification analysis is applied to the difference between the line currents on the forward and reverse sides of the tap point (i.e., the difference between the currents measured by the CMDs 40a-1 and 40a-2) before and during the fault.

Explaining further, the current on the tapped line segment is computed as the difference between the currents on the forward and reverse main power line segments measured by the forward side and reverse side current monitoring devices (e.g., CMDs 40a-1 and 40a-2). In a first iteration of the fault detection routine, a fault is detected on the tapped line segment using the difference between the currents on the main power line segments on the forward and reverse sides of the tap point. To confirm the fault on the tapped line segment, a second iteration of the fault detection routine is performed on the differential current on the tapped line segment computed as the difference between the current on the tapped line section before and during the fault. The differential current analysis is helpful to resolve any ambiguity that might occur under difficult fault analysis conditions, such as unbalanced loads, high impedance faults, and faults occurring on the tapped line where the currents are much lower than the power line currents, without requiring a third CMD on the tapped line section.

Figure 12:
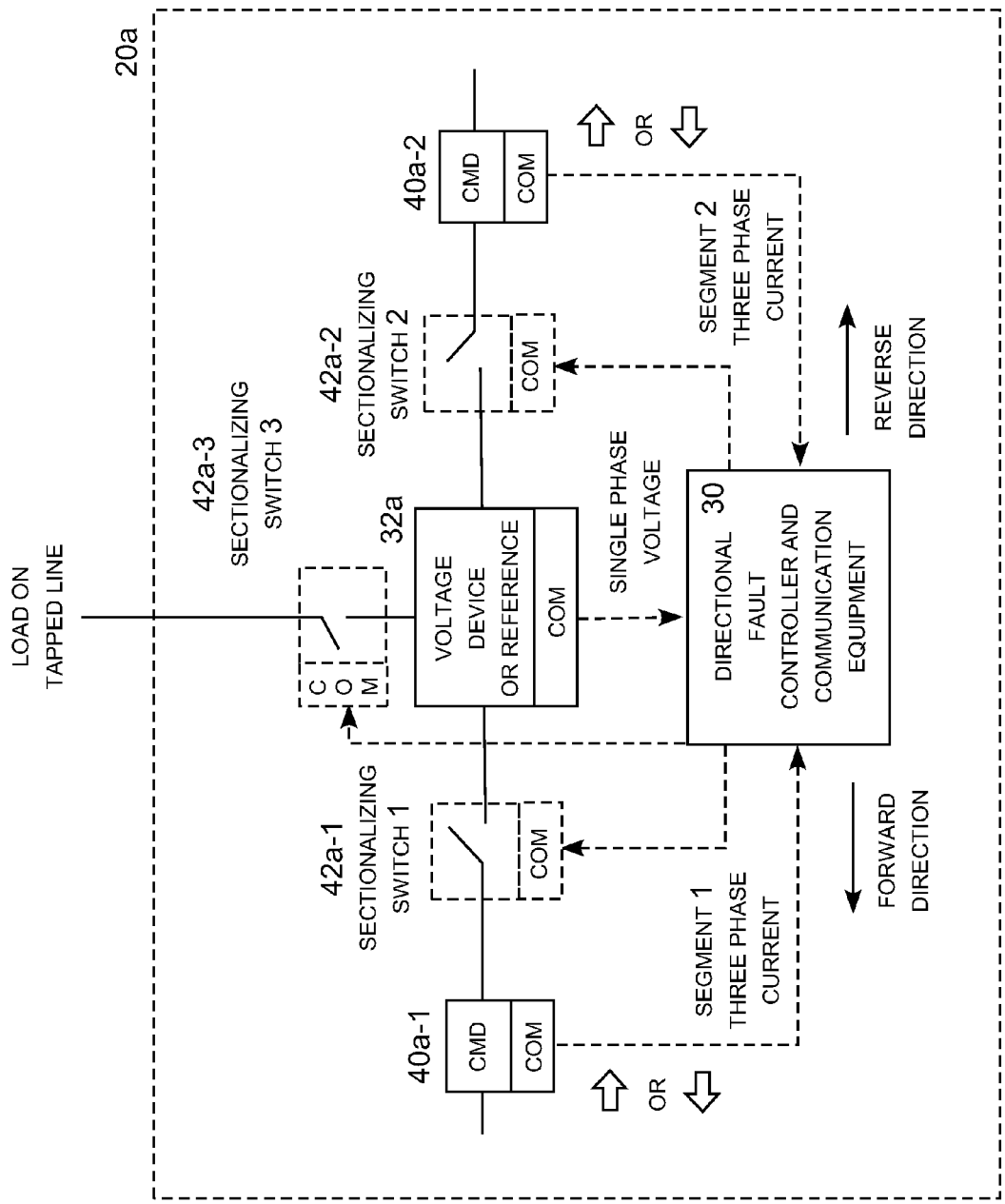
FIG. 12 is a schematic diagram illustrating an alternative directional fault sectionalizing system for a tap point on the loop fed electric power circuit.

FIG. 12 is a schematic diagram illustrating an alternative directional fault sectionalizing system for an illustrative tap point 20a on the loop fed power circuit shown in FIG. 1. This circuit configuration is the same as for the loop fed line shown in FIG. 10, except that a third sectionalizing switch 42a-3 is located on the tapped line section. This allows the sectionalizing system to disconnect the tapped line section by opening sectionalizing switch 42a-3 on the tapped line while keeping the remainder of the line in service when the fault occurs on the tapped line section. In addition, the sectionalizing switch 42a-3 can be opened while the sectionalizing switches 42a-1 42a-2 remain closed when the fault occurs on the tapped line segment. This configuration allows the sectionalizing system to isolate the tapped line segment while providing loop fed power service to the remainder of the power line. FIG. 13 is a chart showing the sectionalizing scheme for the radial electric power circuit.

Those skilled in the art will appreciate that the foregoing describes preferred embodiments of the invention and that many adjustments and alterations will be apparent to those skilled in the art within the spirit and scope of the invention as defined by the appended claims.

The invention claimed is:

1. A directional fault location and isolation system for a three phase electric power line including a main power line and a plurality of tap points, each radially connecting a tapped line section to the main power line, the main power line having a forward direction and a reverse direction, comprising:
at each tap point, monitoring equipment including a forward side current monitoring device and a reverse side current monitoring device, sectionalizing equipment including a forward side sectionalizing switch and a reverse side sectionalizing switch, and communication equipment; and
a directional fault controller comprising communication equipment and processing equipment operative to:
communicate with the monitoring equipment and the sectionalizing equipment at each tap point;
determine directionality of a fault on the power line at each current monitoring device;
identify a faulted line section by identifying a change in the directionality of the fault associated with the faulted line section; and
operate one or more of the sectionalizing switches to isolate the faulted line section from the circuit.

2. The directional fault location and isolation system of claim 1, wherein the directional fault controller comprises a centralized directional fault controller operative for communicating with the monitoring equipment and the sectionalizing equipment at each tap point.

3. The directional fault location and isolation system of claim 1, wherein:
the directional fault controller comprises a plurality of peer-to-peer directional fault controllers, each controlling an associated tap point; and
each peer-to-peer directional fault controller is operative for communicating with a peer-to-peer directional fault controller associated with an adjacent tap point in the forward or reverse direction.

4. The directional fault location and isolation system of claim 3, wherein at least one peer-to-peer directional fault controller is operative for communicating with a peer-to-peer directional fault controller associated with an adjacent tap point in the forward direction and an adjacent tap point in the reverse direction.

5. The directional fault location and isolation system of claim 4, wherein a plurality of the peer-to-peer directional fault controllers are each operative for communicating with a peer-to-peer directional fault controller associated with an adjacent tap point in the forward direction and an adjacent tap point in the reverse direction.

6. The directional fault location and isolation system of claim 1, wherein a fault phase on a tapped line section is detected by applying a fault detection analysis to the difference between the currents on the main power line on the forward side and on the reverse side of the tap point connected to the tapped line section.

7. The directional fault location and isolation system of claim 1, wherein the directional fault controller is further operative to confirm a fault occurring on a tapped line section by implementing a differential current analysis using the difference between the currents on the tapped line section before and during the fault.

8. The directional fault location and isolation system of claim 1, wherein the directional fault controller is further operative to determine directionality of a fault at each current monitoring device using three phase current measurements provided by the current monitoring device and a single phase voltage measurement or reference.

9. The directional fault location and isolation system of claim 8, wherein the directional fault controller is further operative to:
identify a faulted phase of the power line; and
determine directionality of the fault on the faulted phase.

10. A method for locating and isolating faults on a three phase electric power line including a main power line and a plurality of tap points, each radially connecting a tapped line section to the main power line, the main power line having a forward direction and a reverse direction, comprising the steps of:
at each tap point, providing monitoring equipment including a forward side current monitoring device and a reverse side current monitoring device, sectionalizing equipment including a forward side sectionalizing switch and a reverse side sectionalizing switch, and communication equipment; and
providing a directional fault controller comprising communication equipment and processing equipment operative to:
communicate with the monitoring equipment and the sectionalizing equipment at each tap point;
determine directionality of a fault on the power line at each current monitoring device;
identify a faulted line section by identifying a change in the directionality of the fault associated with the faulted line section; and
operate one or more of the sectionalizing switches to isolate the faulted line section from the circuit.

11. The method of claim 10, further comprising the step of providing a centralized directional fault controller operative to communicate with the monitoring equipment and the sectionalizing equipment at each tap point.

12. The method of claim 10, further comprising the steps of:
providing a plurality of peer-to-peer directional fault controllers, each controlling an associated tap point; and
configuring each peer-to-peer directional fault controller to communicate with a peer-to-peer directional fault controller associated with an adjacent tap point in the forward or reverse direction.

13. The method of claim 10, further comprising the steps of configuring at least one peer-to-peer directional fault controller to communicate with a peer-to-peer directional fault controller associated with an adjacent tap point in the forward direction and an adjacent tap point in the reverse direction.

14. The method of claim 13, further comprising the steps of configuring a plurality of the peer-to-peer directional fault controllers to communicate with a peer-to-peer directional fault controller associated with an adjacent tap point in the forward direction and an adjacent tap point in the reverse direction.

15. The method of claim 10, further comprising the step of detecting a faulted phase on a tapped line section by applying a fault detection analysis to the difference between the currents on the main power line on the forward side and on the reverse side of the tap point connected to the tapped line section.

16. The method of claim 10, further comprising the step of confirming a fault occurring on a tapped line section by implementing a differential current analysis using the difference between the currents on the tapped line section before and during the fault.

17. The method of claim 10, further comprising the step of determining directionality of a fault at each current monitoring device using three phase current measurements provided by the current monitoring device and a single phase voltage measurement or reference.

18. The method of claim 10, further comprising the steps of:
   identifying a faulted phase of the power line; and
   determining directionality of the fault on the faulted phase.

\* \* \* \* \*